(12) United States Patent
Tripathi et al.

(10) Patent No.: US 6,621,339 B2
(45) Date of Patent: Sep. 16, 2003

(54) METHODS AND APPARATUS FOR FACILITATING NEGATIVE FEEDBACK, PROVIDING LOOP STABILITY, AND IMPROVING AMPLIFIER EFFICIENCY

(75) Inventors: Adya Tripathi, San Jose, CA (US); Asit Tripathi, Santa Clara, CA (US)

(73) Assignee: Tripath Technology, Inc., Santa Clara, CA (US)

( * ) Notice: Subject to any disclaimer, the term of this patent is extended or adjusted under 35 U.S.C. 154(b) by 11 days.

(21) Appl. No.: 10/107,524

(22) Filed: Mar. 26, 2002

(65) Prior Publication Data

US 2003/0102912 A1 Jun. 5, 2003

Related U.S. Application Data

(60) Provisional application No. 60/338,099, filed on Nov. 30, 2001.

(51) Int. Cl.$^7$ ................................................. H03G 3/20
(52) U.S. Cl. .................... 330/136; 330/151; 330/207 A
(58) Field of Search ................................. 330/107, 136, 330/151, 207 A, 251

(56) References Cited

U.S. PATENT DOCUMENTS

| | | | |
|---|---|---|---|
| 4,326,170 A | 4/1982 | Levy | 330/10 |
| 4,673,889 A | 6/1987 | Cini et al. | 330/10 |
| 4,949,048 A | 8/1990 | Tokumo et al. | 330/10 |
| 5,023,566 A | 6/1991 | El-Hamamsy et al. | 330/251 |
| 5,479,337 A | 12/1995 | Voigt | 363/131 |
| 5,777,512 A | 7/1998 | Tripathi et al. | 330/207 |
| 6,271,722 B1 * | 8/2001 | Ballantyne | 330/51 |
| 6,362,683 B1 | 3/2002 | Miao et al. | 330/10 |
| 6,362,685 B1 * | 3/2002 | Vagher | 330/124 R |

* cited by examiner

*Primary Examiner*—Henry Choe
(74) *Attorney, Agent, or Firm*—Beyer, Weaver & Thomas LLP

(57) ABSTRACT

An amplifier is described having an amplification stage in a first feedback loop. The amplification stage is operable to open the first feedback loop during operation of the amplifier. The amplifier further comprises a feed forward path bypassing the amplification stage. The feed forward path is operable to provide a second feedback loop when the first feedback loop is open.

62 Claims, 5 Drawing Sheets

METHODS AND APPARATUS FOR FACILITATING NEGATIVE FEEDBACK, PROVIDING LOOP STABILITY, AND IMPROVING AMPLIFIER EFFICIENCY

RELATED APPLICATION DATA

The present application claims priority from U.S. Provisional Patent Application No. 60/338,099 for METHODS AND APPARATUS FOR INCREASING THE EFFICIENCY OF AN RF POWER AMPLIFIER filed on Nov. 30, 2001, the entire disclosure of which is incorporated herein by reference for all purposes.

BACKGROUND OF THE INVENTION

The present invention relates to amplifier efficiency. More specifically, the invention provides techniques by which substantial improvements in amplifier efficiency may be realized without unacceptable increases in distortion.

Efficient power amplification is typically of fundamental importance in the operation of electrical and electronic systems. This is particularly true with regard to mobile communication systems. A great deal of the design effort for radio frequency (RF) communication devices is focused on improving the power efficiency of the RF amplifiers upon which such devices are based. Some designers have opted to base their devices on more efficient amplifier configurations such as, for example, class B, class E, or class F amplifiers. However, while such configurations are highly efficient, their nonlinear operation typically results in levels of out-of-band noise which are unacceptable because of the interference with adjacent communication channels.

On the other hand, amplifiers biased for class A or class AB operation do not, by definition, introduce such nonlinearities. Unfortunately, because the devices upon which such amplifiers are based are biased in their linear regions of operation, the efficiency with which such amplifiers operate is still undesirably low. This is exacerbated by the fact that mobile RF communication devices are typically required to operate well below their peak efficiency points. That is, most such devices have their greatest efficiency at higher output power levels. However, in a typical cellular device system, the closest cell transceiver receives the initial transmission from a cellular device and instructs the cellular device to back off on its output power level until a threshold level is reached below which the cell would not be able to detect transmissions from the device. That is, the cell transmits power control bits to the cellular device with which the device sets the output power level only to the level necessary to establish the link to the cell. This power management achieves the goal of maximizing the number of user which may be assigned to a given channel.

Some systems have employed bias control techniques to improve the power efficiency of RF amplifiers. In such systems, either or both of the bias voltage and bias current applied to the power output stage of an RF amplifier is manipulated with reference to the magnitude of the input RF signal to achieve a more efficient operation point than if the bias point was fixed. A discussion of bias control techniques as well as an example of a dual bias control technique is provided in a paper by Kyounghoon Yang et al. entitled *High-Efficiency Class-A Power Amplifiers with Dual-Bias-Control Scheme*, IEEE Transactions on Microwave Theory and Techniques, Vol. 47, No. 8, pp. 1426–1432, August 1999, the entirety of which is incorporated herein by reference for all purposes.

Unfortunately, there are significant limitations on how far bias techniques can go before nonlinearities are introduced which result in unacceptable distortion both inside and outside of the band of interest. That is, for example, when a cellular base station tells a particular device to transmit at a certain power level, this is typically achieved by setting the bias voltage for the RF amplifier at a certain level. This is due to the fact that the output power level is directly proportional to the square of the peak-to-peak excursion of the amplifier's output which, in turn, is limited by the amplifier bias voltage. Therefore, the alternative for improving the power efficiency of the amplifier is to lower the bias current for the power transistor(s). However, the bias current for a typical device in an RF amplifier cannot go much below a certain level (which is device and technology dependent) before the distortion due to such nonlinearities reaches unacceptable levels.

In some amplifier designs, noise-shaping negative feedback techniques may be employed to reduce in-band distortion. Examples of such techniques are described in International Application No. PCT/US01/06780 for RF COMMUNICATION SYSTEM USING AN RF DIGITAL AMPLIFIER filed on Mar. 1, 2001, the entire disclosure of which is incorporated herein by reference for all purposes. Unfortunately, the most common configuration in RF amplifiers today is a single, common emitter/drain transistor with the collector/source coupled to a positive bias voltage through an inductor, a configuration which is not amenable to negative feedback techniques.

That is, the transistor in such amplifiers is biased well into its linear region of operation when conducting, but is typically off for much of the negative swing of the input RF signal being amplified (i.e., the inductor is conducting during this part of the cycle). Thus, the forward signal path of the amplifier becomes effectively an open circuit for roughly half of the signal cycle, introducing an effective delay which would undermine the stability of any negative feedback loop. That is, as is well known in feedback theory, a delay in a feedback loop results in an effective phase shift between the input signal and the feedback signal. When the delay is of sufficient magnitude and the phase shift approaches 180 degrees, the intended negative feedback becomes positive feedback and creates the potential for instability in the amplifier which typically takes the form of undamped oscillations.

In view of the foregoing, it is desirable to provide techniques by which the power efficiency of RF amplifiers may be improved while maintaining low distortion levels.

SUMMARY OF THE INVENTION

According to the present invention, an amplifier configuration is provided in which noise shaping feedback techniques are employed to reduce in-band distortion even where a feedback loop including the power switching device(s) is broken during some portion of the operational cycle. This is achieved by providing a feed forward path in parallel with a portion of the forward signal path of the amplifier which maintains loop integrity during all portions of amplifier operation. Even more generally, the feed forward path of the present invention may be employed to facilitate the use of negative feedback techniques in a wide variety of amplifier topologies for which such techniques were previously problematic to because of loop stability problems.

Thus, the present invention provides an amplifier comprising an amplification stage in a first feedback loop. The amplification stage is operable to open the first feedback loop during operation of the amplifier. The amplifier further comprises a feed forward path bypassing the amplification stage. The feed forward path is operable to provide a second feedback loop when the first feedback loop is open.

According to a more specific embodiment, an amplifier having a frequency band of interest associated therewith is provided. The amplifier comprises a frequency selective network, an amplification stage, and feedback circuitry in a first feedback loop. The frequency selective network is operable to provide noise shaping in the frequency band of interest using negative feedback via the feedback circuitry. The amplification stage is operable to open the first feedback loop during operation of the amplifier. The amplifier further comprises feed forward circuitry coupled to the first feedback loop and bypassing the amplification stage. The feed forward circuitry is operable to provide a second feedback loop when the first feedback loop is open thereby preserving amplifier loop stability.

According to an even more specific embodiment, a radio frequency (RF) amplifier having a frequency band of interest associated therewith is provided. The RF amplifier comprises a frequency selective network, an amplification stage, and feedback circuitry in a first feedback loop. The frequency selective network includes at least one resonator for providing noise shaping in the frequency band of interest using negative feedback via the feedback circuitry. The amplification stage comprises a switch and an inductor which are operable to alternately conduct load current. The switch is operable to open the first feedback loop while the inductor is conducting the load current. The RF amplifier further comprises feed forward circuitry coupled to the first feedback loop and bypassing the amplification stage. The feed forward circuitry is operable to provide a second feedback loop when the first feedback loop is open thereby preserving amplifier loop stability.

A further understanding of the nature and advantages of the present invention may be realized by reference to the remaining portions of the specification and the drawings.

DETAILED DESCRIPTION OF SPECIFIC EMBODIMENTS

Specific embodiments of the invention will now be described with reference to the accompanying figures. Some of these descriptions will refer to features which are not essential to the invention and are merely included to provide complete descriptions of the corresponding embodiments. It should be understood that the scope of the invention should not be limited by the description of such features. It should also be understood that detailed descriptions of features which are well known or understood by those of skill in the art have, in some cases, been omitted so as not to obscure other more important aspects of the invention.

Figure 1:
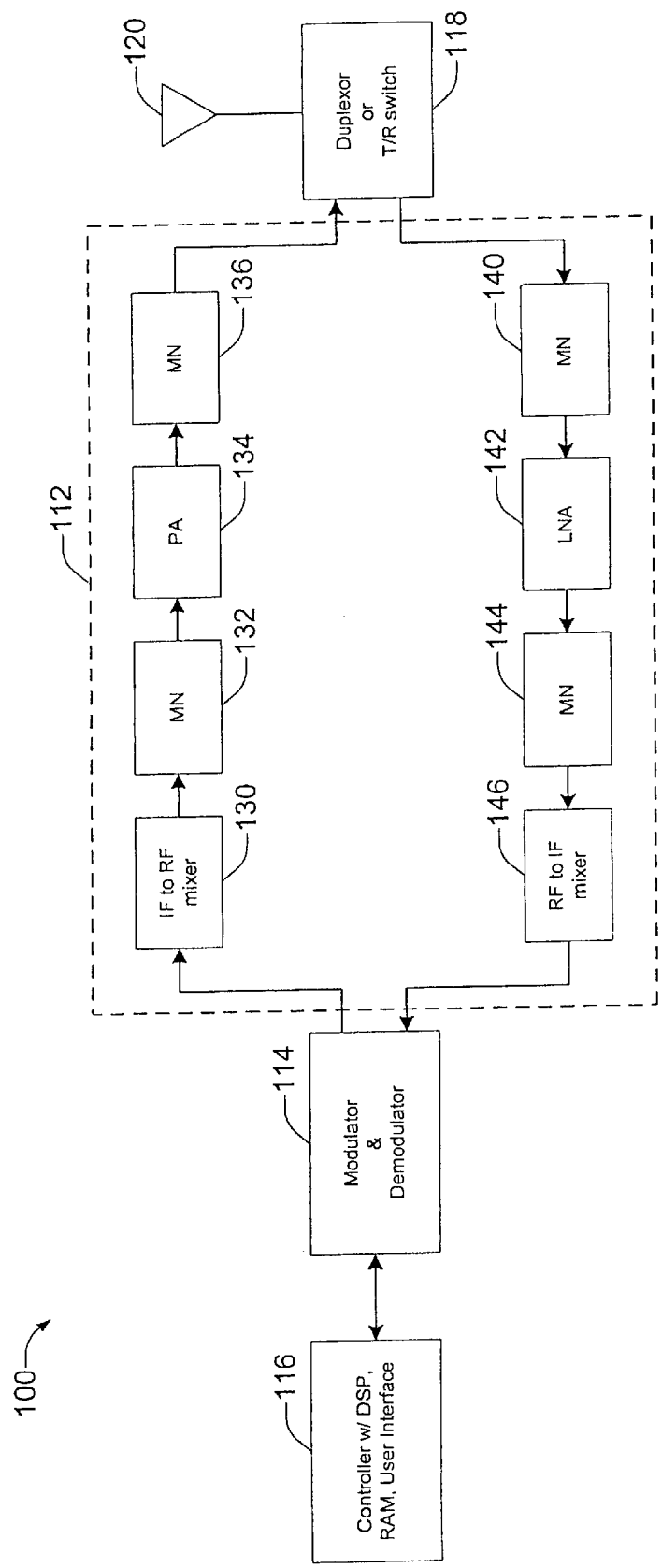
FIG. 1 is a block diagram of a wireless communication device designed according to a specific embodiment of the present invention.

FIG. 1 is a simplified block diagram of a wireless communication device, and more specifically a cellular phone 100 designed according to a specific embodiment of the present invention. It should be noted at the outset that the innovations provided by the present invention are not limited to RF or even wireless devices in general. That is, the present invention may be employed to provide loop stability in any type of amplifier configuration in which feedback loops are broken during some portion of the amplifier's operation.

Cell phone 100 includes an RF block 112, a modulation and demodulation block 114, a controller block 116 including DSP, RAM, user interface, base band circuitry configured to generate a base band signal, and other standard circuitry used in a cell phone, a duplexor or a T/R switch 118 (a duplexor switch is used for cell phones that transmit and receive at the same time, a T/R switch is used for cell phones that transmit and receive alternately), and antenna 120. During transmission the base band circuitry in controller 116 is responsible for generating a base band signal, which is typically a string of bits representative of the information to be transmitted. The base band signal is then modulated in block 114 with an intermediate frequency (IF) modulation signal which is then provided to RF block 112. Since the functionality of the modulation and demodulation block 114, controller 116, duplexor/T/R switch 118 and antenna 120 are all well known in the art, a detailed description of each is not provided herein.

RF block 112 includes an IF to RF mixer 130 for generating an RF signal (e.g., 900 MHz) from the modulated signal received from controller 116 through modulator 114, a matching network (MN) 132, a power amplifier (PA) 134 configured to amplify the RF signal, and another matching network (MN) 136. During transmission, amplifier 134 amplifies the RF signal and provides it to antenna 120 via matching network 136 and duplexor/T/R switch 118. On the receive side, RF block 112 includes a matching network 140 configured to receive an RF signal (e.g., 980 MHz) received by antenna 120, an LNA Amplifier 142, another matching network 144, an RF to IF mixer 146 which mixes down the RF signal to the IF range and then provides it to the demodulator in block 114. Demodulator 114 demodulates the transmitted base band information and provides it to controller 116. Since mixer circuits 130 and 146, LNA 142, and matching networks 132, 140 and 144 are all well known, they are not described in detail herein.

Figure 2:
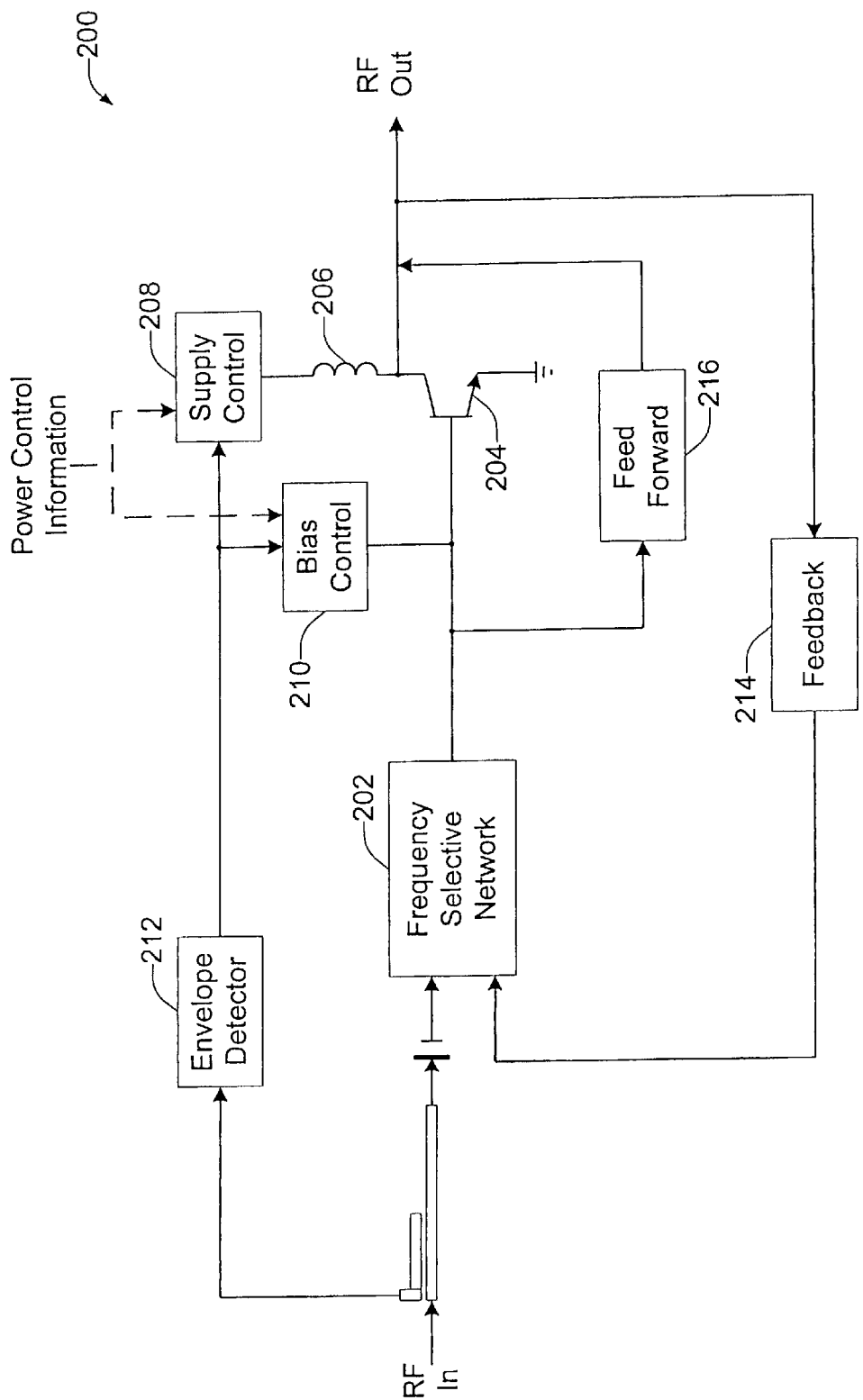
FIG. 2 is a block diagram of an RF power amplifier designed according to a specific embodiment of the present invention.

FIG. 2 is a block diagram of an amplifier 200 designed according to a specific embodiment of the present invention. According to an even more specific embodiment, amplifier 200 comprises an RF amplifier which may be employed as PA 134 in the wireless device of FIG. 1. The main forward signal path includes a noise-shaping frequency selective network 202 for reducing in-band noise.

Figure 3:
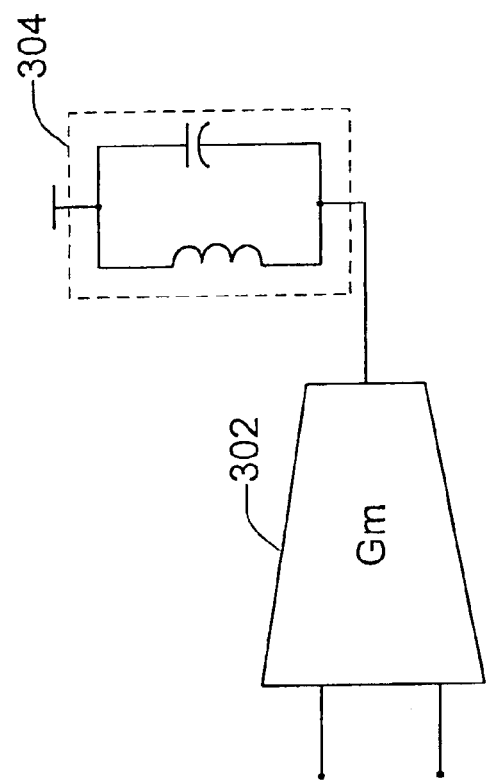
FIG. 3 is a simplified schematic of a resonator stage which may be employed with various band pass embodiments of the invention.

According to various embodiments, frequency selective network 202 may comprise one or more resonator stages (e.g., for band pass embodiments) such as the band pass circuit shown in FIG. 3 represented by a transconductance 302 and an LC resonator 304 which is tuned to the frequency band of interest. Alternatively, network 202 may comprise one or more integrator stages (e.g., for base band embodiments).

The power amplification stage comprises a single common-emitter transistor 204 coupled through an inductor 206 to supply control circuitry 208 which provides the supply voltage. The bias current for transistor 204 is supplied by bias control circuitry 210. As will be discussed below, the amplification stage shown is merely exemplary and a wide variety of amplifier configurations are within the scope of the invention.

Supply control circuitry 208 and bias control circuitry 210 are part of a dual bias control scheme which manipulates the operation point of transistor 204. This may be done using a variety of mechanisms and for a variety of reasons including, for example, improved efficiency for a given input signal level as indicated by envelope detection circuitry 212. In addition or alternatively, supply control circuitry 208 may set the bias voltage for the power amplification stage to achieve a given output power level as dictated by power control bits received from a nearby base station (power control information signal 213). Independent of or in conjunction with this, bias control circuitry 210 may be used to manipulate the bias current to transistor 204 for improved power efficiency for a given bias voltage using, for example, information from either of circuitry 212 or signal 213.

According to various embodiments, each of supply control circuitry 208 and bias control circuitry 210 can select its bias point from among a plurality of bias points in response to any of a variety of stimuli. That is, for example, supply control circuitry 208 could be operable to select from among a plurality of supply voltages in response to the input signal level, power control bits, battery charge level, etc. Similarly, bias control circuitry 210 could be operable to select from among a plurality of bias currents based on any of these or additional stimuli.

The basic idea for a dual bias control scheme is discussed in the IEEE article by Yang et al. incorporated herein by reference above. However, as will become clear, the present invention provides innovations by which such a bias control technique may achieve even higher efficiency and lower distortion than previous techniques. That is, as discussed above, the efficiency improvements achieved with bias control techniques are typically offset by increased distortion both inside and outside of the band of interest. For example, the closer an amplifier, e.g., transistor 204, is biased to class B operation, the higher the intermodulation (IM) product and the resulting distortion. Therefore, according to various embodiments of the invention, the IM product is lowered by using negative feedback.

Referring once again to FIG. 2 and according to one such embodiment, a continuous-time feedback path 214 provides such negative feedback to noise shaping frequency selective network 202. The amount of improvement in the IM product is equal to loop gain with network 202 and feedback 214 providing a higher gain within the band of interest. The improvement of close-in distortion is achieved at the expense of higher distortion products outside of the band of interest. However, such distortion is not a problem because it can be easily filtered out (e.g., using matching network 136 of FIG. 1).

According to various embodiments, feedback circuitry 214 may comprise any combination of active and passive elements for achieving a wide variety of feedback objects including, for example, increasing bandwidth, increasing linearity, gain control, bias stabilization, and impedance control.

As mentioned above, when an amplification stage in a conventional negative feedback loop is biased close to class B operation, loop stability become very difficult to maintain. This is due to the fact that the power device is typically turned off during most of the negative cycle resulting in open loop. This opening and closing of the loop during each cycle causes instability. Therefore, according to the present invention, this stability problem is solved by providing a feed forward path in parallel with the amplification stage which ensures feedback loop integrity regardless of the state of the power device(s) upon which the amplification stage is based. This, in turn, allows the amplification stage of the amplifier (e.g., transistor 204) to be biased well below the bias points achievable with previous amplifier designs resulting in significant power efficiency improvements. For example, as mentioned above, the output transistor in a typical RF power amplifier in a cellular device has a bias current of more than 100 mA. Using the techniques of the present invention, this bias current can be controlled to be as low as 10 mA.

According to a specific embodiment of the invention and as illustrated in FIG. 2, feed forward circuitry 216 is provided which bypasses transistor 204 and maintains a closed feedback loop (including feedback circuitry 214 and frequency selective network 202) even when transistor 204 is not conducting. With the introduction of feed forward circuitry 216, transistor 204 may be biased much more closely to class B operation than possible with previous amplifier topologies. That is, the negative feedback and noise shaping provided by feedback circuitry 214 and frequency selective network 202 reduce the distortion due to the increased IM product resulting from more extreme bias control points, while feed forward circuitry 216 stabilizes the loop. According to various embodiments, feed forward circuitry 216 may comprise any unilateral circuits such as, for example, small active devices biased in the linear region.

Figure 4:
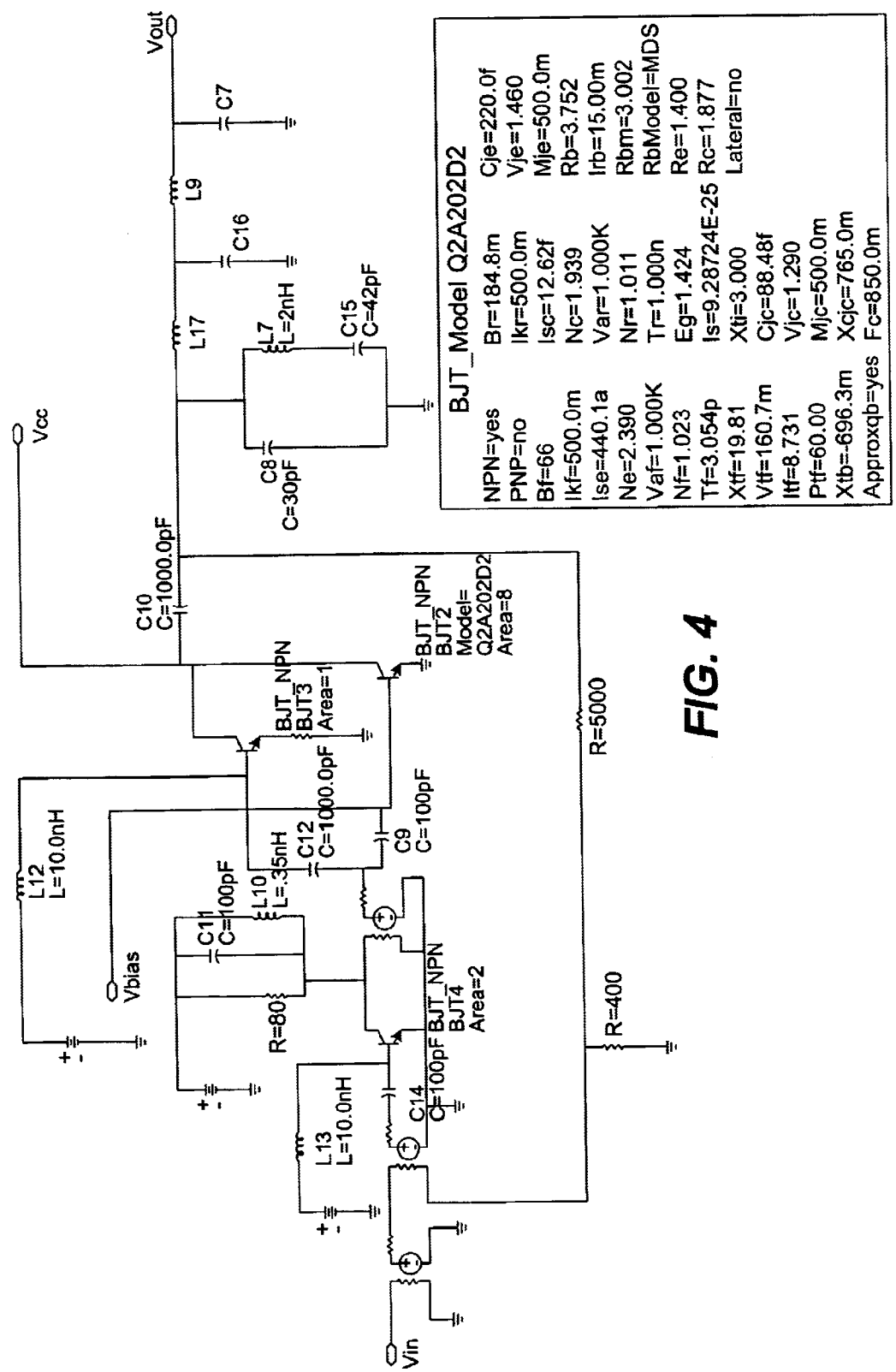
FIG. 4 is a more detailed schematic diagram of an RF amplifier designed according to a specific embodiment of the present invention.

Portions of a more specific implementation of the embodiment of FIG. 2 are illustrated in the schematic of FIG. 4. According to the embodiment shown, the feed forward path is implemented using a common-emitter transistor BJT3 which is biased in the "on" condition with a 1.5 VDC supply voltage coupled to the base terminal, and the collector terminal of which is coupled to the output of the amplification stage, i.e., at the collector of the power device, transistor BJT2. The inductor for the amplification stage is not shown and connects to the circuit via the port designated Port, Vcc, Num=3. As indicated by the die area indicator (i.e., Area=1), BJT3 is a relatively small device which, according to one embodiment, is biased "on" all the time but draws a very small amount of current relative to the collector current of BJT2. Feedback is provided using a simple resistive divider network coupled to output capacitor C10.

Amplifiers based on the designs of FIGS. 2 and 4 may be used in a wide variety of wireless devices which rely on different modulation schemes. According to various specific embodiments, such amplifiers are used in wireless devices based on the Code Division Multiple Access (CDMA) and Wideband CDMA standards. Amplifiers designed according to the present invention are particularly advantageous for such devices operating under such standards because of the necessity for accurately reproducing both phase and amplitude information which, in turn, necessitates very low distortion requirements. It will be understood, however, that amplifiers designed according to the present invention may also be used in other types of wireless communication networks including, for example, Global System for Mobile Communications (GSM) networks, Advanced Mobile Phone System (AMPS), Time Division Multiple Access (TDMA), General Packet Radio Service (GPRS), Enhanced Data rates for GSM Evolution (EDGE), Personal Digital Cellular (PDC), Universal Mobile Telecommunication System (UMTS), IS-36, IS-95A, IS-95B, and IS-136, networks.

Amplifiers designed according to the invention may also be used to implement wireless LANs which employ, among others, any of Bluetooth, Home RF, IEEE 802.11a, IEEE 802.11b, IEEE 802.16, and HiperLAN2.

Figure 5:
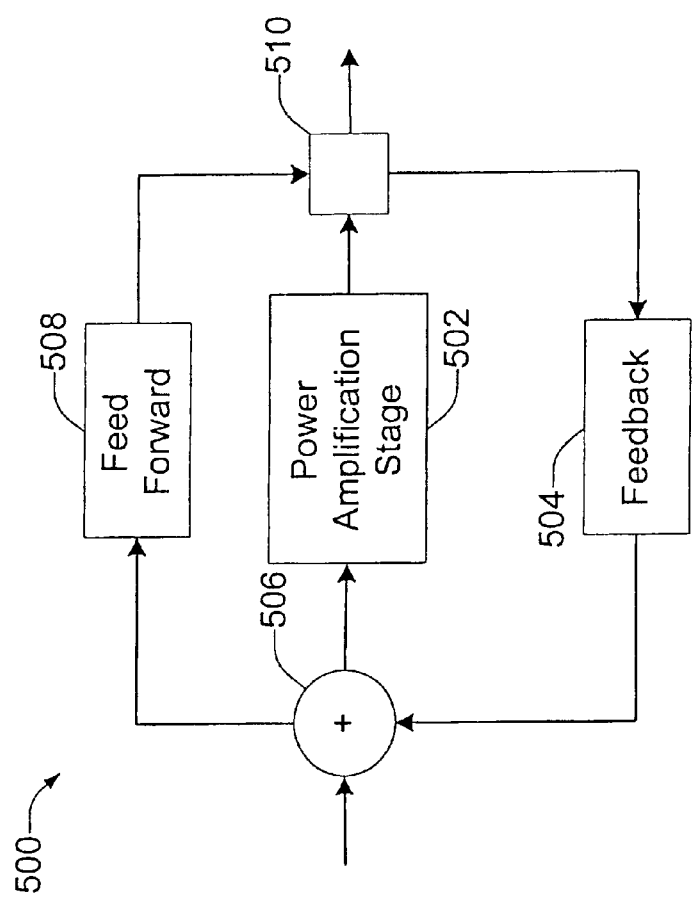
FIG. 5 is a block diagram of an amplifier designed according to a more generalized embodiment of the invention.

FIG. 5 shows a more generalized embodiment of an amplifier 500 designed according to the present invention which is not limited to any particular base band or band pass implementation. Power amplification stage 502 may comprise any of a wide variety of amplifier topologies implemented using any of a variety of discrete component or integrated circuit technologies. The circuit devices on which stage 502 may be based can range from CMOS bipolar devices to discrete power MOSFETs to vacuum tubes. The amplification may be achieved using one or multiple devices. The class of amplification stage 502 may also be selected from a wide variety of amplifier classes including, for example, classes B, AB, C, D, E, F, G, and H. The common feature which characterizes all of the different amplifier topologies which are within the scope of the invention is that the forward signal path including the amplification stage (and thus the feedback loop of which it is a part) becomes open during at least a portion of its operational cycle.

Feedback circuitry 504 couples the output of amplifier 500 to summing circuitry 506. Feedback circuitry 504 may comprise any type of circuitry for implementing negative feedback (e.g., any combination of active and passive devices), and may be provided for any of the purposes for which negative feedback is employed (e.g., bias stabilization, control of amplifier gain, increased bandwidth, reductions in nonlinear distortion, improved signal-to-noise ratio, control of input or output impedances, etc.). The common feature characterizing all of the different feedback circuits which are within the scope of the present invention is that they provide continuous-time feedback.

Summing circuitry 506 may also comprise any of a variety of circuit components which connect feedback 504 to amplification stage 502. That is, circuitry 506 may be anything from a single, low impedance node (e.g., a direct connection) to preliminary amplification or filtering stages having varying levels of complexity (e.g., multi-stage, resonator or integrator based, noise shaping networks).

Feed forward circuitry 508 provides a signal path from summing circuitry 506 which bypasses power amplification stage 502 and maintains a feedback loop when the forward signal path through amplification stage 502 is open. According to various embodiments of the invention, feed forward circuitry may comprises a wide variety of combinations of active and passive elements having varying levels of complexity, representing a wide variety of transfer functions, and presenting varying levels of impedance. Also according to various embodiments of the invention, the signal level associated with feed forward circuitry 508 may vary considerably relative to the signal level associated with the amplification stage which it bypasses. More generally, the relationship between these two signal levels will be determined by the requirements of the particular application, lying between the minimum feed forward signal required to stabilize the loop and the maximum feed forward signal which can be tolerated without unduly degrading the forward transfer function of the amplifier.

It should also be understood that according to various embodiments of the invention, the integrity of the signal path through feed forward circuitry need not be constant. That is, the feed forward path of the present invention stabilizes the amplifier when the feedback loop through the amplification stage is open. Thus, the feed forward path need only be provided for a sufficient period of time to provide such stability. Therefore, embodiments of the present invention are contemplated in which the feed forward path may itself be open during some portion of the operational cycle of the amplifier.

To further generalize the nature of amplifier 500, amplification stage 502, feedback circuitry 504, and feed forward circuitry 508 are shown coupled together via output circuitry 510. According to various embodiments of the invention, circuitry 510 may comprise anything from a low impedance node (e.g., a direct connection between any of 502, 504, and 508) to any combination of active and passive circuit elements which effect the various feed forward and feedback objectives of the widely varying implementations which are within the scope of the present invention.

It should be noted that the basic amplifier configuration represented by amplifier 500 of FIG. 5 may be employed to implement a wide variety of devices and products both inside and outside of the wireless domain. For example, as described above, this basic configuration may be used to implement RF amplifiers for both wireless devices and base stations in wireless networks. Such wireless networks could be telecommunications networks, e.g., cellular network, mobile computing networks, e.g., wireless LANs, and home networks, e.g., wireless entertainment networks. Examples outside the wireless domain include line drivers for wireline networks, e.g., cable and DSL networks.

While the invention has been particularly shown and described with reference to specific embodiments thereof, it will be understood by those skilled in the art that changes in the form and details of the disclosed embodiments may be made without departing from the spirit or scope of the invention. For example, although specific embodiments have been described herein with reference to exemplary values of bias currents, it will be understood that the specific values of amplifier bias current are only relevant to the invention in that they illustrate the type of improvement which can be realized using values which are typical of a specific process technology. That is, even though advancements in process technology may result in transistors having linear operating regions well below the 100 mA mentioned above, the present invention will still be able to allow bias currents well below such linear operating regions to be used.

It should also be understood that the present invention is not limited to amplifiers with any particular amplification stage configuration, or to achieve only a specific feedback objective. Rather, as discussed above, the scope of the invention encompasses any amplifier having an amplification stage in a feedback loop which, during some phase of its operation, breaks the continuity of the feedback loop of which it is a part. And, in general, the techniques of the present invention may be employed to bring any of the varied benefits of negative feedback to amplifier topologies for which such feedback techniques were not previously employed because of loop stability concerns.

In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. An amplifier comprising an amplification stage in a first feedback loop, the amplification stage being operable to open the first feedback loop during operation of the amplifier, the amplifier further comprising a feed forward path bypassing the amplification stage, the feed forward path being operable to provide a second feedback loop when the first feedback loop is open.

2. The amplifier of claim 1 further comprising a frequency selective network to operable to provide noise shaping in a frequency band of interest using negative feedback.

3. The amplifier of claim 2 wherein the frequency selective network comprises at least one resonator stage.

4. The amplifier of claim 2 wherein the frequency selective network comprises at least one integrator stage.

5. The amplifier of claim 1 further comprising bias control circuitry for controlling a bias point associated with the amplification stage.

6. The amplifier of claim 5 wherein the bias control circuitry comprises bias voltage control circuitry for controlling a bias voltage associated with the amplification stage, and bias current control circuitry for controlling a bias current associated with the amplification stage.

7. The amplifier of claim 6 wherein the bias voltage control circuitry is operable to set the bias voltage at one of a plurality of bias voltage values, and wherein the bias current control circuitry is operable to set the bias current at one of a plurality of bias current values.

8. The amplifier of claim 5 wherein the bias control circuitry is operable to control the bias point in response to any of an input signal level, power control information received from a remote device, and battery charge information.

9. The amplifier of claim 1 wherein the amplification stage comprises a single transistor and an inductor which are operable to alternately conduct load current.

10. The amplifier of claim 1 wherein the amplification stage at least one switching device.

11. The amplifier of claim 10 wherein the at least one switching device comprises any of a field-effect transistor, a bipolar junction transistor, and a vacuum tube.

12. The amplifier of claim 1 wherein the amplification stage is characterized by operation in one of classes B, AB, C, D, E, F, G, and H.

13. The amplifier of claim 1 having a frequency band of interest associated therewith.

14. The amplifier of claim 13 wherein the frequency band of interest is the radio frequency (RF) band.

15. The amplifier of claim 13 wherein the frequency band of interest is the base band.

16. The amplifier of claim 1 wherein the first and second feedback loops comprise feedback circuitry.

17. The amplifier of claim 16 wherein the feedback circuitry comprises a plurality of passive circuit components.

18. The amplifier of claim 16 wherein the feedback circuitry comprises a combination of active and passive components.

19. The amplifier of claim 1 wherein the feed forward path comprises at least one passive circuit component.

20. The amplifier of claim 1 wherein the feed forward path comprises at least one active component.

21. The amplifier of claim 20 wherein the at least one active component comprises one of a common-emitter transistor and a common-source transistor coupled between an output and an input of the amplification stage.

22. An electronic system comprising the amplifier of claim 1.

23. The electronic system of claim 22 wherein the electronic system comprises one of a mobile wireless communication device and a wireless base station in a wireless communication network.

24. The electronic system of claim 23 wherein the wireless communication network is one of a Code Division Multiple Access (CDMA) network, a Wideband Code Division Multiple Access (WCDMA) network, a Global System for Mobile Communications (GSM) network, an Advanced Mobile Phone System (AMPS) network, a Time Division Multiple Access (TDMA) network, a General Packet Radio Service (GPRS) network, an Enhanced Data rates for GSM Evolution (EDGE) network, a Personal Digital Cellular (PDC) network, and a Universal Mobile Telecommunication System (UMTS) network.

25. The electronic system of claim 23 wherein the wireless communication network is a wireless local area network.

26. An amplifier having a frequency band of interest associated therewith, the amplifier comprising a frequency selective network, an amplification stage, and feedback circuitry in a first feedback loop, the frequency selective network being operable to provide noise shaping in the frequency band of interest using negative feedback via the feedback circuitry, the amplification stage being operable to open the first feedback loop during operation of the amplifier, the amplifier further comprising feed forward circuitry coupled to the first feedback loop and bypassing the amplification stage, the feed forward circuitry being operable to provide a second feedback loop when the first feedback loop is open thereby preserving amplifier loop stability.

27. The amplifier of claim 26 wherein the frequency selective network comprises at least one resonator stage.

28. The amplifier of claim 26 wherein the frequency selective network comprises at least one integrator stage.

29. The amplifier of claim 26 further comprising bias control circuitry for controlling a bias point associated with the amplification stage.

30. The amplifier of claim 29 wherein the bias control circuitry comprises bias voltage control circuitry for controlling a bias voltage associated with the amplification stage, and bias current control circuitry for controlling a bias current associated with the amplification stage.

31. The amplifier of claim 30 wherein the bias voltage control circuitry is operable to set the bias voltage at one of a plurality of bias voltage values, and wherein the bias current control circuitry is operable to set the bias current at one of a plurality of bias current values.

32. The amplifier of claim 29 wherein the bias control circuitry is operable to control the bias point in response to any of an input signal level, power control information received from a remote device, and battery charge information.

33. The amplifier of claim 26 wherein the amplification stage comprises a single transistor and an inductor which are operable to alternately conduct load current.

34. The amplifier of claim 26 wherein the amplification stage at least one switching device.

35. The amplifier of claim 34 wherein the at least one switching device comprises any of a field-effect transistor, a bipolar junction transistor, and a vacuum tube.

36. The amplifier of claim 26 wherein the amplification stage is characterized by operation in one of classes B, AB, C, D, E, F, G, and H.

37. The amplifier of claim 26 wherein the frequency band of interest is the radio frequency (RF) band.

38. The amplifier of claim 26 wherein the frequency band of interest is the base band.

39. The amplifier of claim 26 wherein the feedback circuitry comprises a plurality of passive circuit components.

40. The amplifier of claim 26 wherein the feedback circuitry comprises a combination of active and passive components.

41. The amplifier of claim 26 wherein the feed forward circuitry comprises at least one passive circuit component.

42. The amplifier of claim 26 wherein the feed forward circuitry comprises at least one active component.

43. The amplifier of claim 42 wherein the at least one active component comprises a common-emitter transistor coupled between an output and an input of the amplification stage.

44. An electronic system comprising the amplifier of claim 26.

45. The electronic system of claim 43 wherein the electronic system comprises one of a mobile wireless communication device and a wireless base station in a wireless communication network.

46. The electronic system of claim 45 wherein the wireless communication network is one of a Code Division Multiple Access (CDMA) network, a Wideband Code Division Multiple Access (WCDMA) network, a Global System for Mobile Communications (GSM) network, an Advanced Mobile Phone System (AMPS) network, a Time Division Multiple Access (TDMA) network, a General Packet Radio Service (GPRS) network, an Enhanced Data rates for GSM Evolution (EDGE) network, a Personal Digital Cellular (PDC) network, and a Universal Mobile Telecommunication System (UMTS) network.

47. The electronic system of claim 45 wherein the wireless communication network is a wireless local area network.

48. A radio frequency (RF) amplifier having a frequency band of interest associated therewith, the RF amplifier comprising a frequency selective network, an amplification stage, and feedback circuitry in a first feedback loop, the frequency selective network including at least one resonator for providing noise shaping in the frequency band of interest using negative feedback via the feedback circuitry, the amplification stage comprising a switch and an inductor which are operable to alternately conduct load current, the switch being operable to open the first feedback loop while the inductor is conducting the load current, the RF amplifier further comprising feed forward circuitry coupled to the first feedback loop and bypassing the amplification stage, the feed forward circuitry being operable to provide a second feedback loop when the first feedback loop is open thereby preserving amplifier loop stability.

49. The amplifier of claim 48 further comprising bias control circuitry for controlling a bias point associated with the amplification stage.

50. The amplifier of claim 49 wherein the bias control circuitry comprises bias voltage control circuitry for controlling a bias voltage associated with the amplification stage, and bias current control circuitry for controlling a bias current associated with the amplification stage.

51. The amplifier of claim 50 wherein the bias voltage control circuitry is operable to set the bias voltage at one of a plurality of bias voltage values, and wherein the bias current control circuitry is operable to set the bias current at one of a plurality of bias current values.

52. The amplifier of claim 49 wherein the bias control circuitry is operable to control the bias point in response to any of an input signal level, power control information received from a remote device, and battery charge information.

53. The amplifier of claim 48 wherein the switch comprises either of a field-effect transistor and a bipolar junction transistor.

54. The amplifier of claim 48 wherein the amplification stage is characterized by operation in class AB.

55. The amplifier of claim 48 wherein the feedback circuitry comprises a plurality of passive circuit components.

56. The amplifier of claim 48 wherein the feedback circuitry comprises a combination of active and passive components.

57. The amplifier of claim 48 wherein the feed forward circuitry comprises at least one passive circuit component.

58. The amplifier of claim 48 wherein the feed forward circuitry comprises at least one active component.

59. The amplifier of claim 58 wherein the at least one active component comprises a common-emitter transistor coupled between an output and an input of the amplification stage.

60. An electronic system comprising the amplifier of claim 48.

61. The electronic system of claim 60 wherein the electronic system comprises one of a mobile wireless communication device and a wireless base station in a wireless communication network.

62. The electronic system of claim 61 wherein the wireless communication network is one of a Code Division Multiple Access (CDMA) network, a Wideband Code Division Multiple Access (WCDMA) network, a Global System for Mobile Communications (GSM) network, an Advanced Mobile Phone System (AMPS) network, a Time Division Multiple Access (TDMA) network, a General Packet Radio Service (GPRS) network, an Enhanced Data rates for GSM Evolution (EDGE) network, a Personal Digital Cellular (PDC) network, and a Universal Mobile Telecommunication System (UMTS) network.

* * * * *